United States Patent [19]

Kamikawa et al.

[11] Patent Number: 5,226,437
[45] Date of Patent: Jul. 13, 1993

[54] WASHING APPARATUS

[75] Inventors: Yuji Kamikawa, Uto; Masafumi Inoue, Ichikawa; Mitsuo Nishi, Kumamoto, all of Japan

[73] Assignees: Tokyo Electron Limited, Tokyo; Tokyo Electron Kyushu Limited, Kumamoto, both of Japan

[21] Appl. No.: 795,762

[22] Filed: Nov. 21, 1991

[30] Foreign Application Priority Data

Nov. 28, 1990 [JP] Japan ................... 2-331312
May 8, 1991 [JP] Japan ................... 3-131672

[51] Int. Cl.$^5$ ............................................. B08B 3/02
[52] U.S. Cl. ........................... 134/104.1; 134/140; 134/902
[58] Field of Search ............... 134/902, 140, 164, 165, 134/196, 137, 104.1

[56] References Cited

U.S. PATENT DOCUMENTS

| 1,869,287 | 7/1932 | Thomas et al. | 134/164 |
|---|---|---|---|
| 3,426,772 | 2/1969 | Foster | 134/164 X |
| 4,471,716 | 9/1984 | Milliren | 134/137 X |
| 4,722,752 | 2/1988 | Steck | 134/902 X |
| 4,902,350 | 2/1990 | Steck | 134/137 X |
| 4,936,328 | 6/1990 | Yatake | 134/902 X |
| 4,974,619 | 12/1990 | Yu | 134/902 |

FOREIGN PATENT DOCUMENTS

| 477995 | 10/1926 | Fed. Rep. of Germany | 134/137 |
|---|---|---|---|
| 62-281430 | 12/1987 | Japan | 134/902 |

Primary Examiner—Frankie L. Stinson
Attorney, Agent, or Firm—Oblon, Spivak, McClelland, Maier & Neustadt

[57] ABSTRACT

A washing apparatus for performing a batch treatment of a plurality of wafers has a vessel and a wafer boat dedicated to the vessel and movable in the vertical direction. The boat has a fork, which supports the wafers in the vessel in a manner such that the wafers are spaced from one another at predetermined intervals. The wafers are received in a carrier, and are transferred to the boat by a rotary transfer arm. This arm has a fork for supporting the wafers during transfer thereof in a manner such that the wafers are spaced from one another at the predetermined intervals. Transfer of the rotary transfer arm is performed above the washing vessel by moving the boat up and down. At this time, the forks of the boat and arm engage with each other.

15 Claims, 11 Drawing Sheets

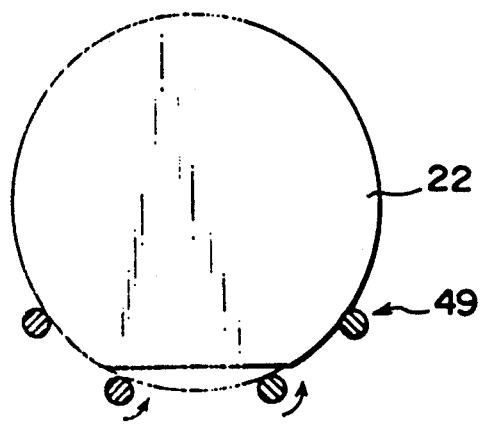
F I G. 3
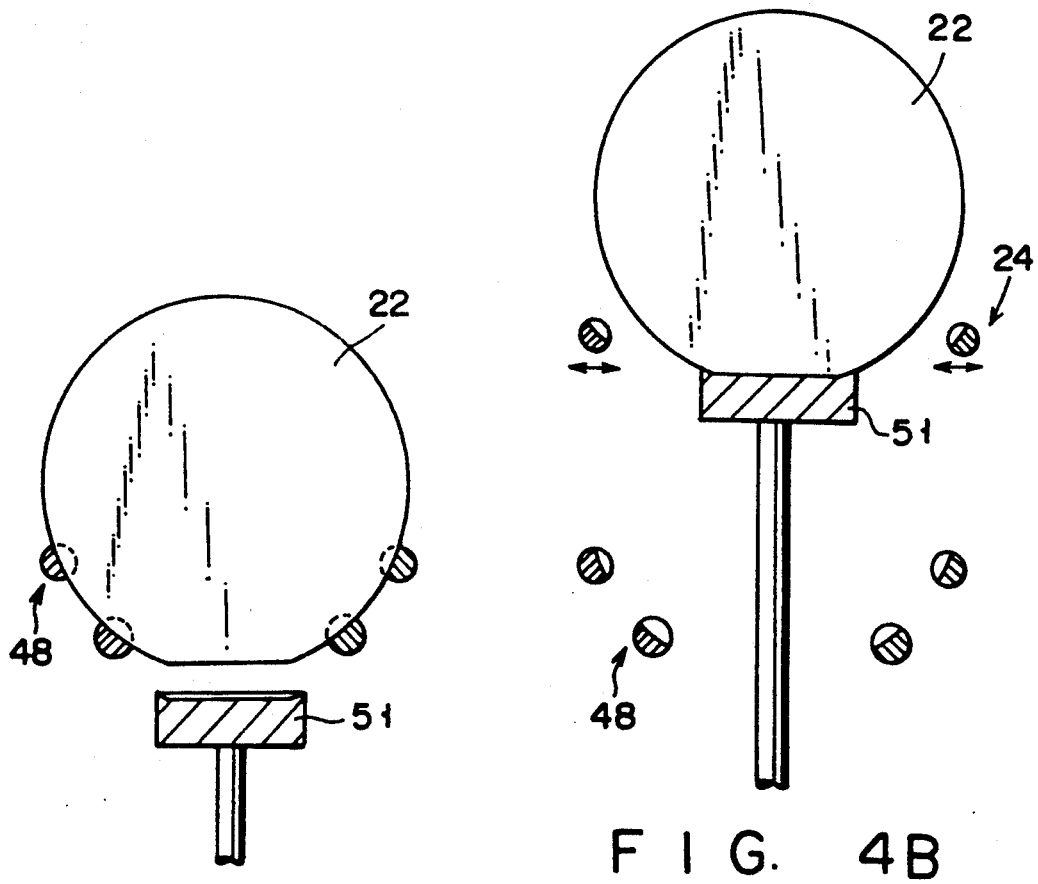
F I G. 4A
F I G. 4B

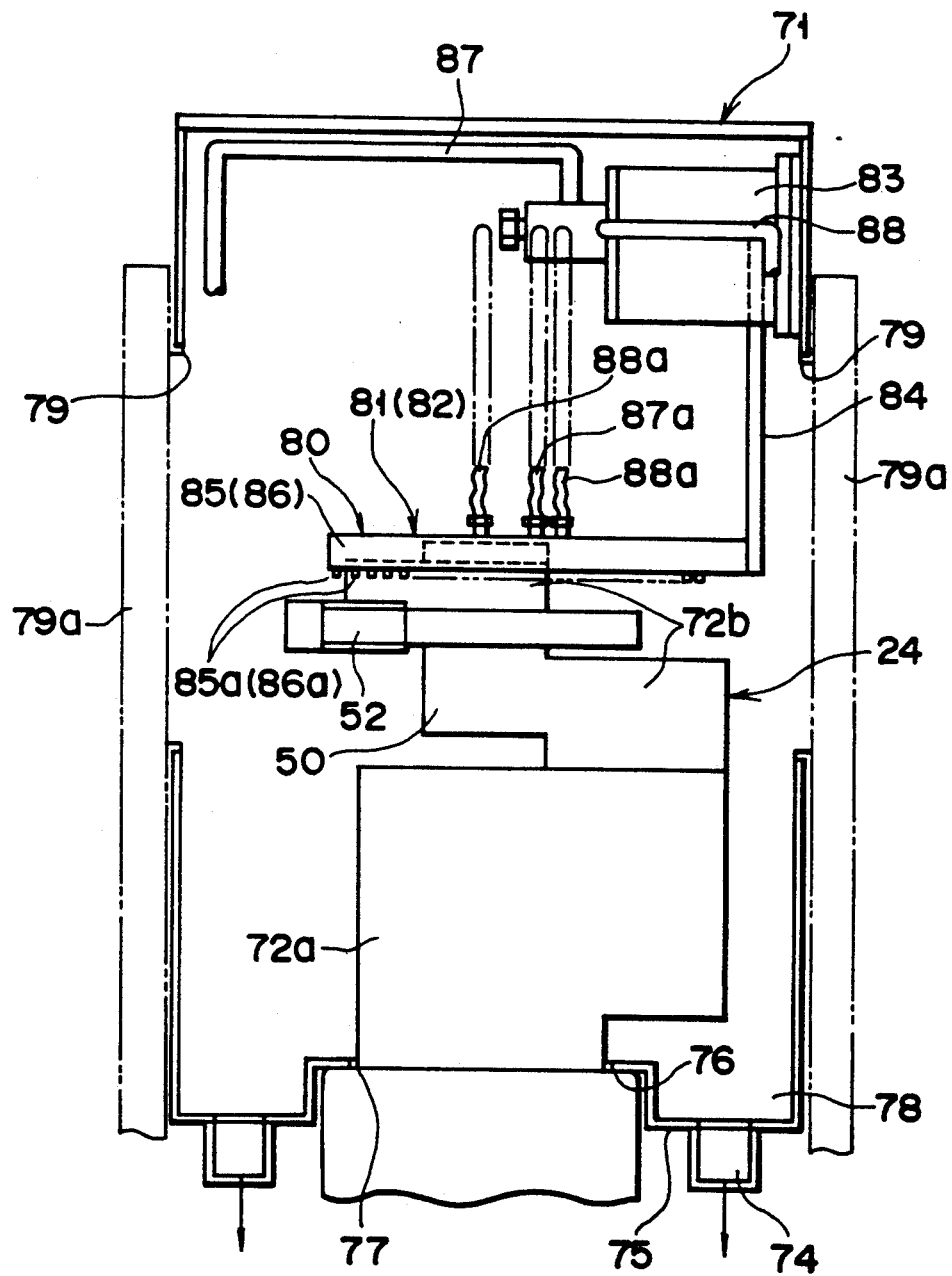
F I G. 10

WASHING APPARATUS

BACKGROUND OF THE INVENTION

1. Field of the Invention

This invention relates to a washing apparatus for washing semiconductor wafers by bringing the wafers into contact with a washing liquid.

2. Description of the Related Art

In a conventional washing apparatus incorporated in a semiconductor wafer-manufacturing system, a plurality (e.g. 25) of semiconductor wafers are placed on a carrier, and are transferred to a washing vessel by means of a transfer unit together with the carrier, and then the wafers and carrier are immersed in a washing liquid.

Immersing the carrier in the washing vessel contaminates the washing liquid due to dust and dirt attached to the carrier, and hence the washing liquid must very often be exchanged for a new one so often, reducing the washing treatment efficiency of the wafers.

Further, the wafers placed on the carrier are washed and dried with the carrier, in the above apparatus, reducing the drying treatment efficiency of the wafers.

SUMMARY OF THE INVENTION

It is the object of the invention to provide a washing apparatus in which carriers employed therein are kept out of contact with a washing liquid, thereby minimizing the degree of contamination of the washing liquid, thus enhancing the washing treatment efficiency, thereby reducing the number of times the washing liquid is exchanged.

According to a first aspect of the invention, there is provided a washing apparatus for performing a batch treatment of a plurality of wafer-like objects, comprising:

a washing vessel;

first support means, dedicated to the washing vessel, for supporting the objects in the vessel in a manner such that the objects are spaced from one another at predetermined intervals;

driving means for moving the first support means up and down;

receiving means for receiving the objects outside the washing vessel;

transfer means for transferring the objects between the receiving means and first support means; and second support means, incorporated in the transfer means, for supporting the objects during transfer thereof in a manner such that the objects are spaced from one another at the same intervals as the predetermined internals;

wherein transfer of the objects between the first and second support means is performed above the washing vessel by moving the first support means up and down.

According to a second aspect of the invention, there is provided a washing apparatus for performing treatment of a plurality of wafer-like objects, comprising:

a washing vessel;

first support means, dedicated to the washing vessel, for supporting the objects in the vessel in a manner such that the objects are spaced form one another at predetermined intervals;

receiving means for receiving the objects outside the washing vessel;

transfer means for transferring the objects between the receiving means and first support means; and second support means, incorporated in the transfer means, for supporting the objects during transfer thereof;

additional washing means for washing the second support means of the transfer means; and isolation means for isolating atmosphere existing around the transfer means from that in the washing vessel during washing of the second support means.

In the washing apparatus, the objects, e.g. semiconductor wafers, placed on the receiving means, e.g. a carrier, are moved from the carrier to the first support means dedicated to the wahsing vessel by means of the transfer means, and are immersed into the washing liquid contained in the washing vessel. Thus, the wafers and first support means are brought into contact with the washing liquid, but the carrier is kept out of contact with the same. Further, the first support means is brought into contact with only the washing liquid used in the washing vessel, so that the degree of contamination of the washing liquid is minimized, thereby enhancing the washing treatment efficiency, and resulting in a reduction in the number of times the washing liquid is exchanged.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 3 is a sectional view, showing an orientation flat aligning mechanism employed in the loader of FIG. 2;

FIGS. 4A and 4B are sectional views, showing operation of a pushing bar employed in the mechanism of FIG. 3;

FIG. 10 is a schematic side view, showing a washing mechanism for washing a rotary transfer arm incorporated in the washing apparatus of FIG. 1;

DETAILED DESCRIPTION OF THE PREFERRED EMBODIMENTS

A washing apparatus according to the invention will be explained in detail with reference to the accompanying drawings showing an embodiment in which the washing apparatus is employed in a semiconductor wafer manufacturing system.

Figure 1:
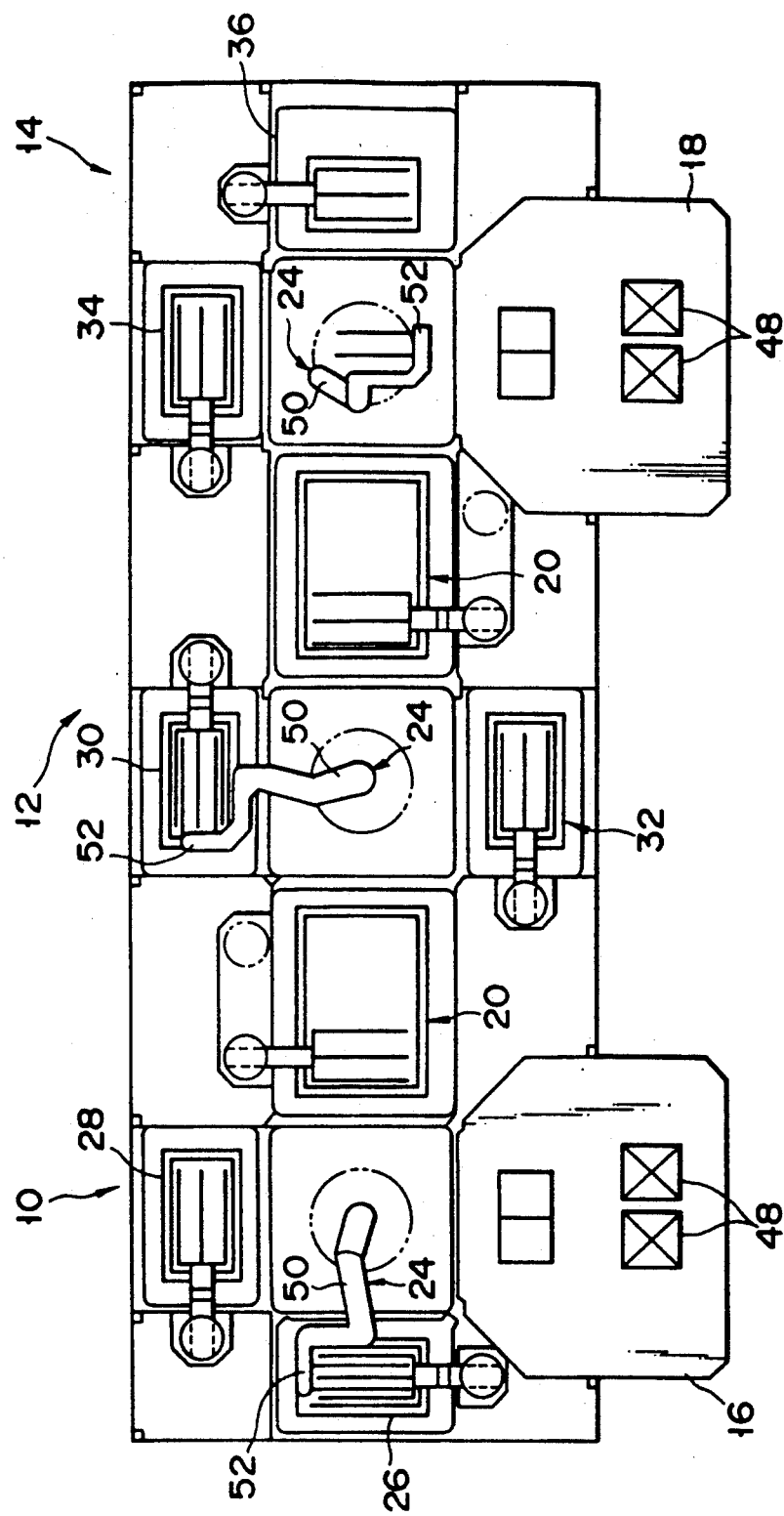
FIG. 1 is a plan view, showing the entire arrangement of a washing apparatus according to a first embodiment of the invention.

As is shown in FIG. 1, the washing apparatus of the embodiment comprises three washing units 10, 12, and 14. The unit 10 arranged on the wafer carry-in side is connected to a loader 16 for loading wafers to be treated. The unit 14 arranged on the wafer carry-out side is connected to an unloader 18 for unloading wafers having been processed. Underwater loaders 20 are provided between the units 10 and 12 and between the units 12 and 14. This arrangement may be changed. In this embodiment, the arrangement is determined to accord to a predetermined washing program.

The washing unit 10 has a rotary transfer arm 24 arranged in the center thereof for transferring a semiconductor wafer 22, and washing vessels 26 and 28 arranged on the left side of the arm 24 and in front of the loader 16, respectively. In the embodiment, the vessel 26 is used as a chemical processing vessel for performing ammonia treatment, while the vessel 28 is used as a quick damp rinse (QDR) vessel for performing water rinse treatment.

In the central washing unit 12, the underwater loaders 20 are arranged on both opposite sides of the rotary transfer arm 24 located in the center of the central washing unit 12, and washing vessels 30 and 32 are arranged in front of the arm 24 and in rear of the same, respectively. The vessel 30 is used as a chemical vessel for performing hydrofluoric acid treatment, while the vessel 32 is used as water overflow treatment vessel.

The washing unit 14 has a rotary transfer arm 24 arranged in the center thereof, and a washing vessel 34 and a drying vessel 36 arranged on the right side of the arm 24 and in front of the loader 18, respectively. In the embodiment, the vessel 34 is used as a final water rinse treatment vessel.

Figure 6:
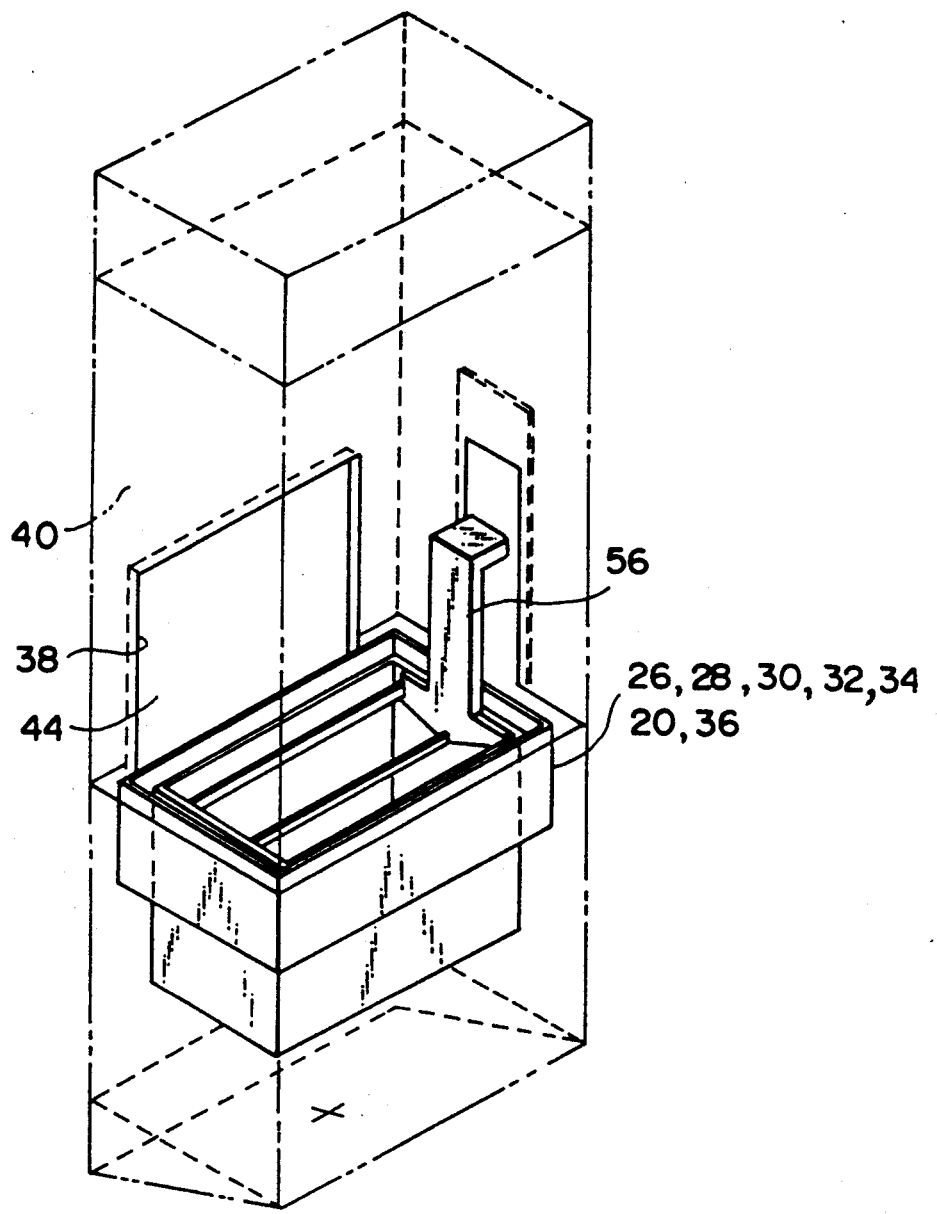
FIG. 6 is a sectional view, showing washing vessels, an underwater loader, and a drying vessel, which are employed in the device of FIG. 1.

As is shown in FIGS. 6 and 10, each of the vessels 26, 28, 30, 32, and 34, underwater loaders 20, and drying vessel 36 is received in a case 40 having an opening 38 for carrying in and out the semiconductor wafer 22 (in the case of the underwater loaders 20, openings 38 are formed in the both opposite sides of each loader). A shutter 44 to be moved up and down by means of two cylinders 42 is provided for opening and closing the opening 38. The atmosphere in the case 40 is shut out from the outside by means of the shutter 44 and an air curtain supplied through an air blow port. In this case, pressure in the case 40 is controlled to a value slightly lower than the atmospheric pressure.

Figure 2:
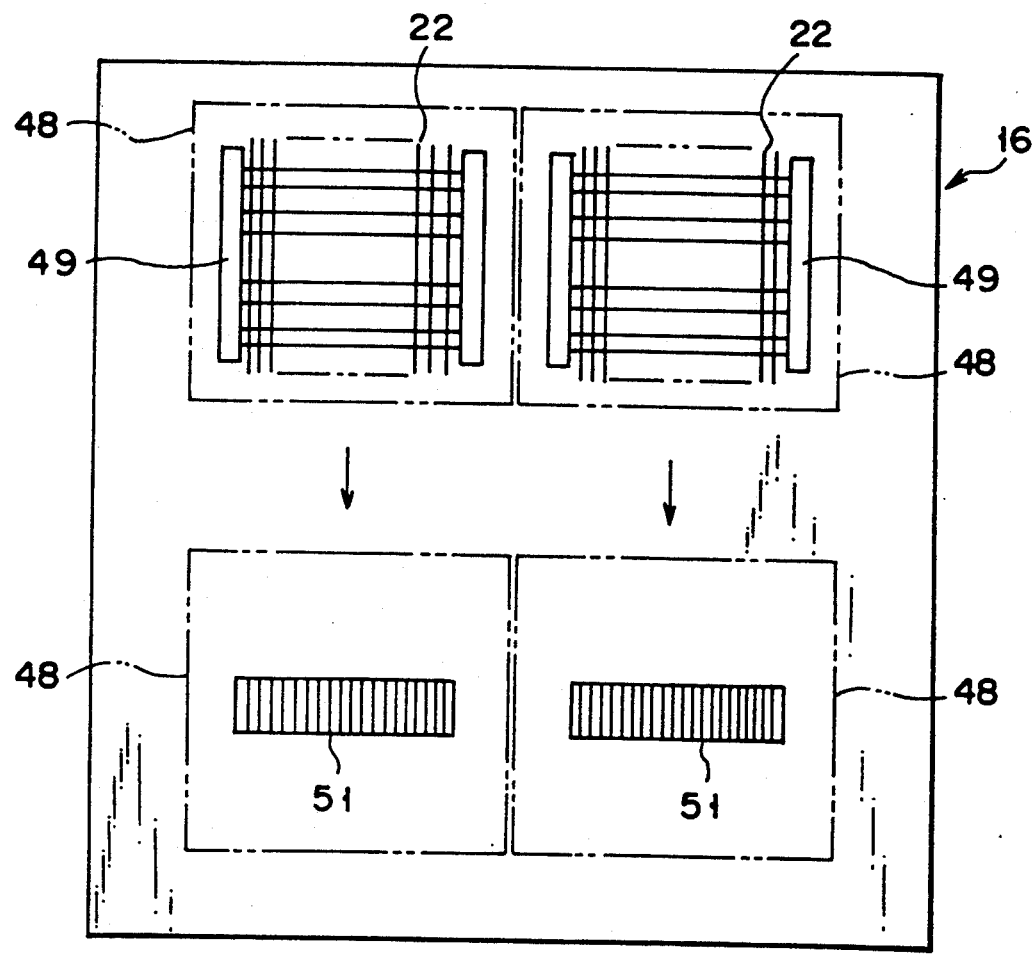
FIG. 2 is a plan view, showing a loader employed in the apparatus of FIG. 1.

As is shown in FIG. 2, the loader 16 performs the following. 50 semiconductor wafers 22 placed on two carriers 48 (i.e., 25 wafers on each carry) are subjected to orientation flat aligning performed by means of an orientation flat aligning mechanism 49 shown in FIG. 3, and then are pushed up by pushing bars 51 shown in FIG. 4. The bars 51 are gathered to each other, where the 50 wafers are received by the rotary transfer arm 24 located on the wafer carry-in side. The unloader 18 has a structure similar to the loader 16, but operates in the order inverse to that in which the loader 16 operates.

Figure 5:
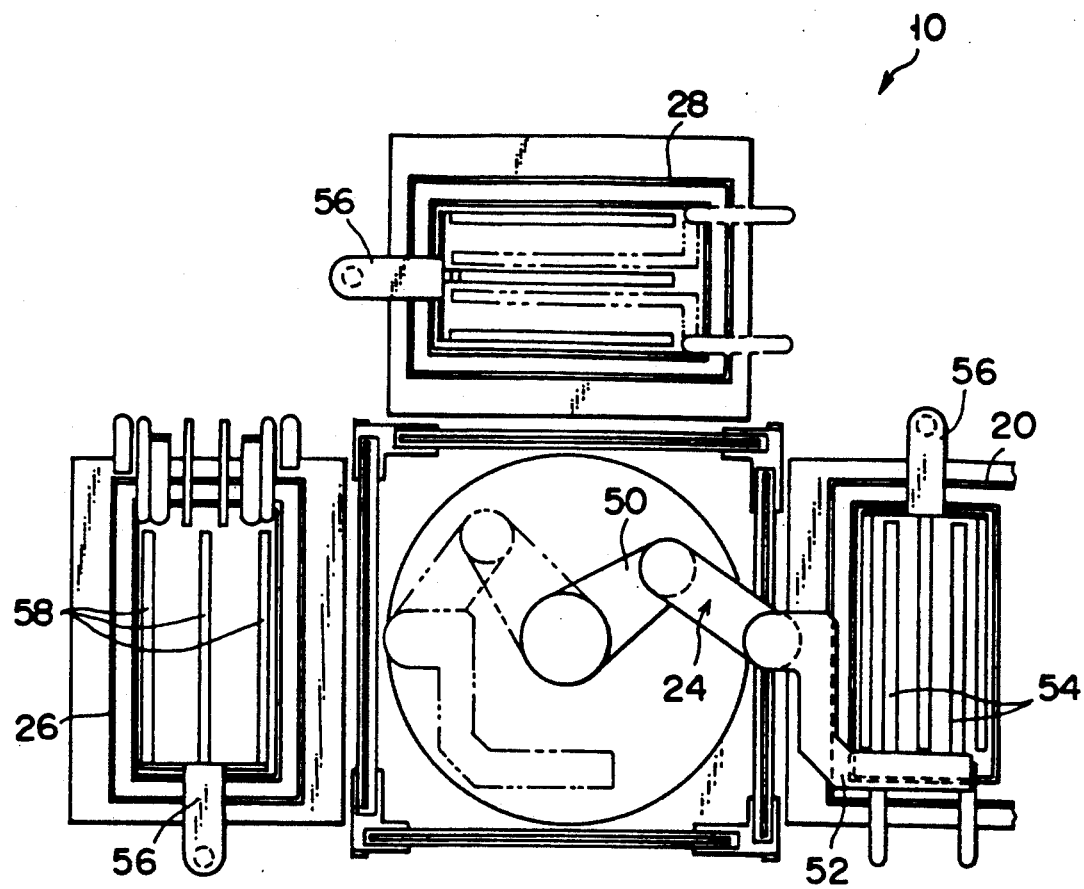
FIG. 5 is an enlarged view, showing a treatment unit arranged on the carry-in side of the device of FIG. 1.

As is shown in FIG. 5, the rotary transfer arm 24 has an arm body 50 having a plurality of joints and being able to expand, contract, and rotate in the horizontal direction. The tip portion of the body 50 is provided with a wafer fork 52 for placing the 50 wafers 22 thereon without the carrier 48. The wafers are transferred from the fork 52 to the loader 16, vessels 26, 28, 30, 32, or 34, underwater loader 20, drying vessel 36, or unloader 18.

Figure 8A:
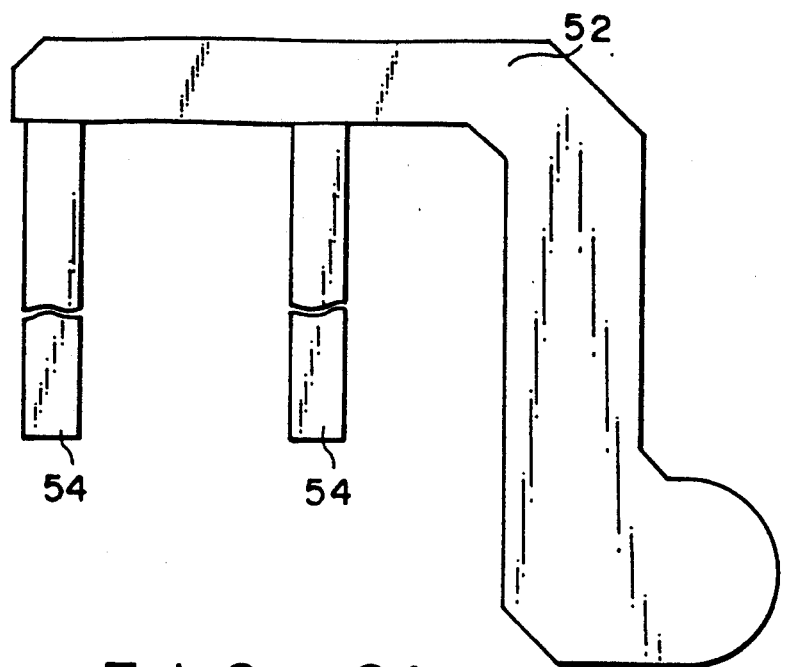
FIG. 8A is a plan view of a wafer fork.
Figure 8C:
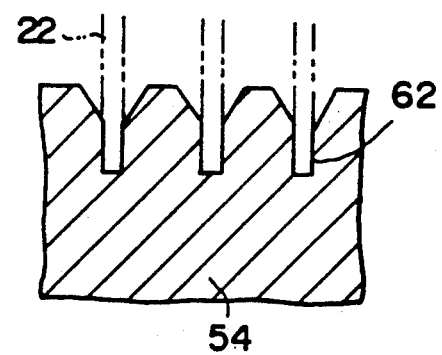
FIG. 8C is a sectional view, taken along line 8C—8C in FIG. 8B.
Figure 8B:
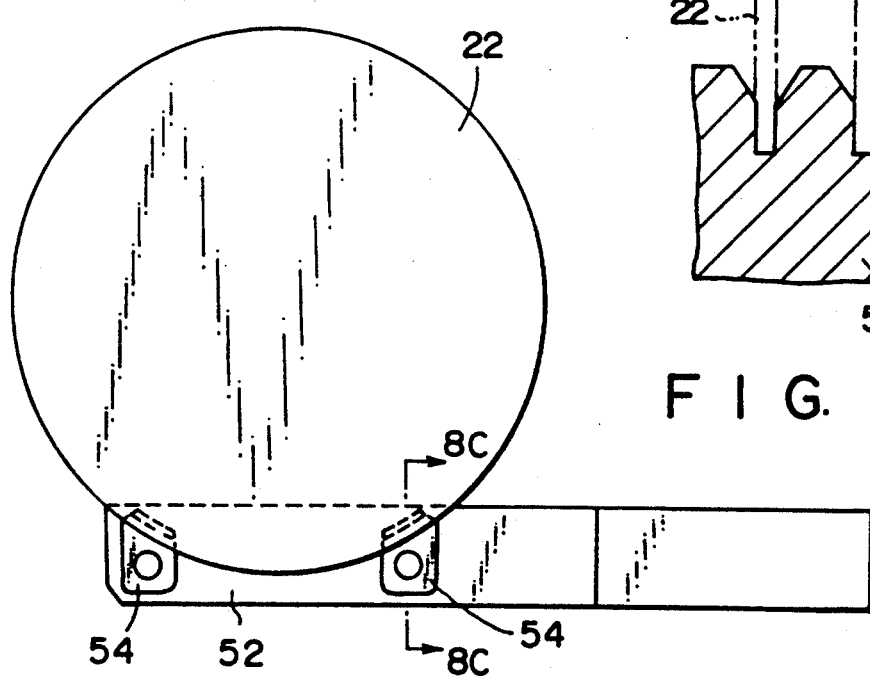
FIG. 8B is a side view of the fork.

Specifically, as is shown in FIGS. 8A to 8C, the fork 52 has two parallel support bars 54 having a plurality of support grooves 62 for positioning the wafers 22, and being movable in the horizontal direction. Between the fork 52 and loader 16 (or unloader 18), the fork 52 receives the wafers 22 from the pushing bars 51 moving up and down between the two support bars 54, and transfer the wafers to the pushing bars 51.

Figure 7:
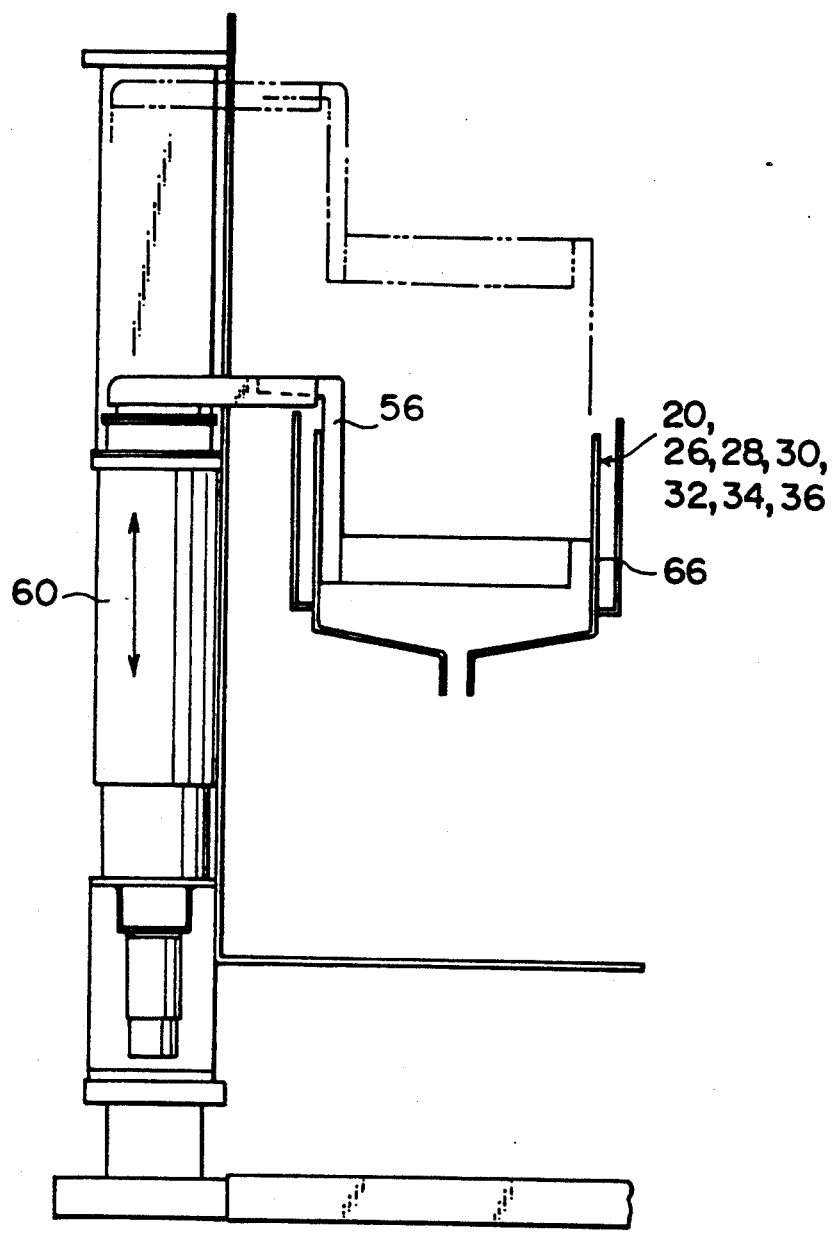
FIG. 7 is a side view, showing an actuator and a boat.

As is shown in FIG. 7, between the fork 52 and underwater loaders 20, washing vessels 26, 28, 30, 32, or 43, or drying vessel 36, the fork 52 receives the wafers 22 from a boat 56 provided for each of the vessels and being movable up and down, and transfers them to the boat 56.

Figure 9A:
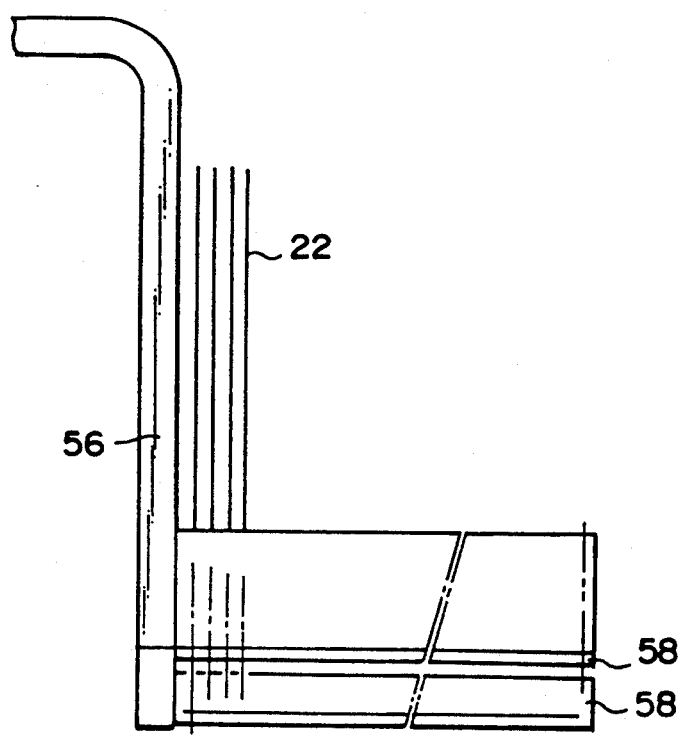
FIG. 9A is a side view of the boat.
Figure 9B:
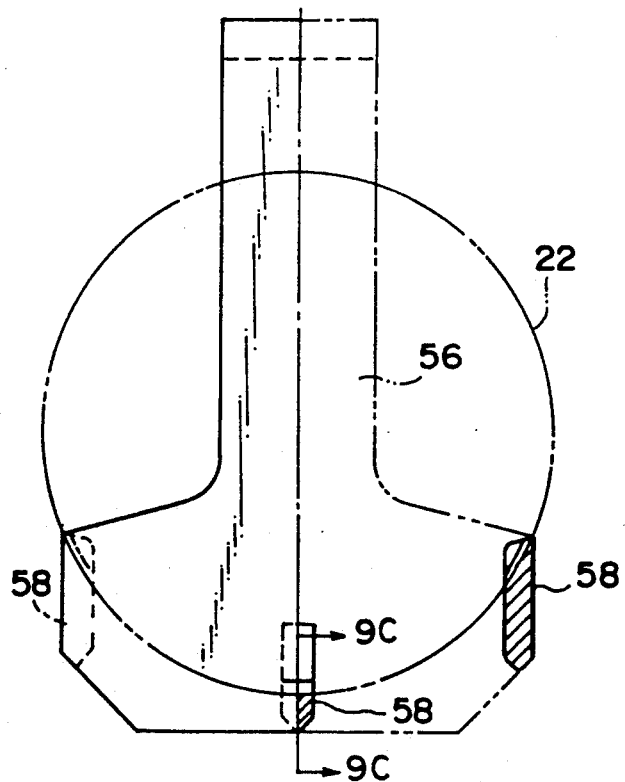
FIG. 9B is a front view of the boat.
Figure 9C:
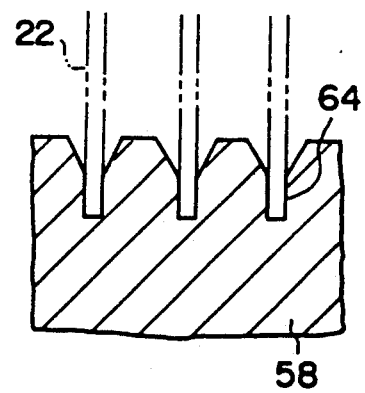
FIG. 9C is a sectional view, taken along line 9C—9C in FIG. 9B.

Each boat 56 has, as shown in FIGS. 9A to 9C, three parallel support bars 58 having a plurality of support grooves 64 for positioning the wafers 22, and can be moved up and down by an actuator 60. The three support bars 58 is arranged so as not to collide with the two support bars 54 of the wafer fork 52 in the up and down directions, and so as to extend along the outline of the wafer 22. The boat 56 does not use the carrier 48 to position the wafers 22.

The main body of the boat 56 is made of silicon carbide (SiC), and is coated with polyether-ether-keton (PEEK). These materials have high purity and high chemical resistance. The boat 56 may alternatively comprise its main body made of PEEK, or made of another material with a coating layer of SiC and an outermost coating layer of PEEK. Further, PEEK may be placed with polychlorotrifluoroethylene (PCTFE) or fluorocarbon resin.

The wafers 22 are placed on the wafer fork 52 of the arm 24, and then the fork 52 is inserted into the vessel through the opening 38. At this time, the actuator 60 is expanded and pushes up the boat 56, whereby the wafers 22 are moved from the fork 52 to the boat 56. On the other hand, where the wafers 22 are placed on the boat 56, the boat 56 is moved up, and then the wafer fork 52 is inserted under the boat 56. The boat 56 is then moved down, thereby moving the wafers 22 to the fork 52.

The actuator 60 supporting the boat 56 may cause dust during its up/down movement, and also may corrode due to a chemical since it is provided in a vessel suing the chemical. Thus, the cylinder of the actuator 60 comprises a plurality of layers so as to prevent the dust from leaking to the outside of the cylinder. Further, pressure in the cylinder is kept at a positive value, and atmosphere in a space defined between intermediate and outer layers is exhausted, so as to prevent the chemical, existing in the vessel, from flowing into the actuator 60.

Then, the operation of the invention will be explained.

First, when the two carriers 48 each having 25 semiconductor wafers 22 mounted therein are transferred to the loader 16, the orientation flat aligning mechanism 49 aligns the wafers 22. Then, the pushing bars 51 push up the wafers, while maintaining the position of the carriers 48 unchanged. Subsequently, the pushing bars 51 move close to each other, thereby positioning 50 wafers 22 at regular intervals.

The rotary transfer arm 24 rotates in the horizontal direction, and extends toward the loader 16, thereby positioning the wafer fork 52 below the pushing bar 51. Then, the pushing bar 51 is moved down, and the wafers 22 are moved onto the wafer fork 52.

Where the wafers 22 are placed on the wafer fork 52, the rotary transfer arm 24 rotates in the horizontal direction, and contracts, thereby inserting the wafers 22 into the washing vessel 26 through the opening 38 formed in the case 40 of the vessel 26. In this state, the boat 56 dedicated to the vessel 26 is moved up by the actuator 60, thereby moving the wafers 22 from the fork 52 onto the boat 56. When the rotary transfer arm 24 is moved out of the case 40 through the opening 38, the shutter 44 closes the opening 38, and the boat 56 is moved down by the actuator 60, thereby immersing the wafers 22 in a washing liquid contained in the vessel 26.

At this time, only the boat 56 and wafers 22 are immersed in the washing liquid, and the carrier 48 is not brought into contact with the liquid. Thus, the degree of contamination of the liquid is low, and hence it is not necessary to exchange the liquid for a new one so often. Moreover, since the boat 56 is made of SiC and coated with PEEK, the degree of contamination of the liquid is further lower.

When washing is finished, the wafers 22 are returned from the boat 56 onto the wafer fork 52 of the rotary transfer arm 24, and are taken out of the case 40. Thereafter, the wafers 22 are forwarded to the next vessel 28. While they are treated in the washing vessel 28 after the transfer is completed, the next 50 wafers 22 are transferred into the vessel 26 by means of the rotary transfer arm 24.

After washing in the washing unit 10 arranged on the carry-in side is finished, the wafers 22 are moved to the boat 56 dedicated to the underwater loader 20 arranged between the unit 10 and the intermediate washing unit 12. Then, the boat 56 is moved in the loader 20, thereby transferring the wafers 22 to the side of the washing unit 12.

In the washing unit 12, the wafers 22 are moved from the underwater loader 20 to the washing vessel 30 by means of the rotary transfer arm 24 dedicated to the unit 12, and are subjected to hydrofluoric acid treatment. Subsequently, the wafers 22 are transferred to the washing vessel 32, and are subjected to water rinse overflow treatment. Then, the wafers 22 are moved to the underwater loader 20 arranged between the unit 12 and the carry-out side washing unit 14, and are transferred thereto.

In the washing unit 14, the wafers 22 are moved from the underwater loader 20 to the washing vessel 34 by mean of the rotary transfer arm 24 dedicated to the unit 14, where they are subjected to final water rinse treatment. Then, the wafers 22 are transferred to the drying vessel 36, and they are dried therein. Subsequently, the wafers 22 are transferred to the unloader 18, where they are divided into two groups, then are subjected to orientation flat alignment treatment, and thereafter are placed on the two carriers 48.

As is described above, since the washing and drying vessels 26, 28, 30, 32, 34, and 36 of the carry-in side washing unit 10, intermediate washing unit 12, and carry-out side washing unit 14 have the boats 56 respectively dedicated thereto, it is not necessary to exchange the washing liquid for a new one so often, and therefore washing treatment efficiency will be enhanced. Further, it is also not necessary to dry the carrier 48 in the drying vessel 36, which will enhance drying treatment efficiency.

Figure 11:
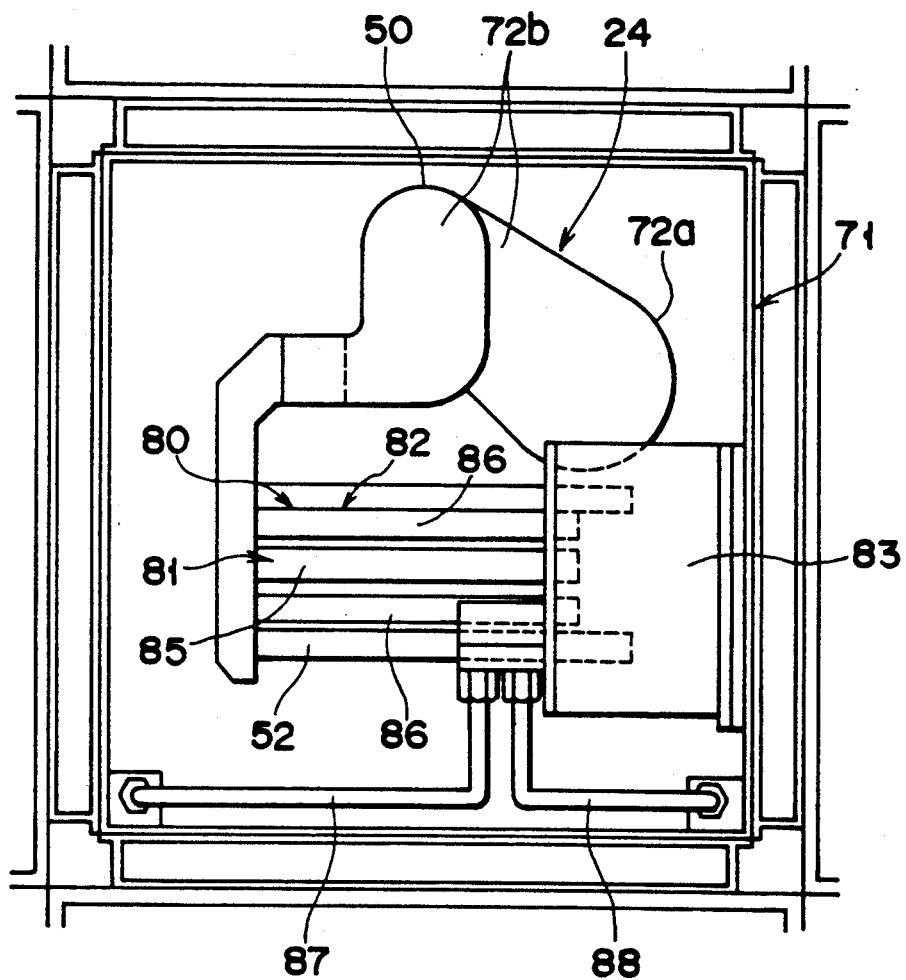
FIG. 11 is a schematic plan view of the washing mechanism of FIG. 10.
Figure 12:
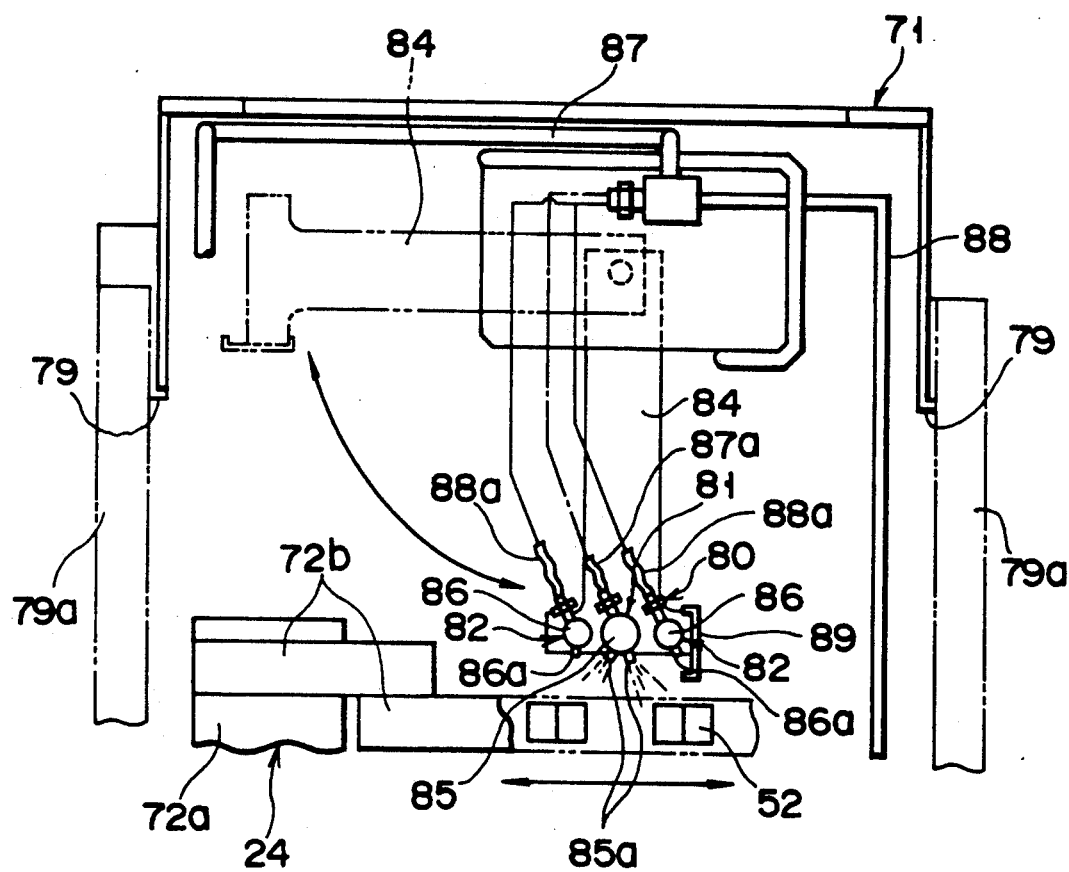
FIG. 12 is a schematic plan view, useful in explaining the operation of the essential part of the washing mechanism of FIG. 10.

FIGS. 10 through 12 show a washing mechanism for washing the rotary transfer arm 24 incorporated in the washing apparatus. The mechanism comprises a case 71 having high chemical resistance and watertightness and housing the arm 24, a washing and drying nozzle member 80 secured to an upper portion of the case 71, and an exhaust ports 74 for exhausting a waste liquid produced after washing. The nozzle member 80 has a washing nozzle 81 for injecting a washing liquid onto the wafer supporting fork 52 secured to the tip of the arm 24, and two drying nozzles 82 for injecting a dry gas (N2 gas).

The rotary transfer arm 24 is provided on an arm base 72a projecting through a hole 76 formed in the bottom 75 of the case 71, and an O-ring 77 is provided between the hole 76 and base 72a. The arm 24 includes an arm body 50 comprising a plurality of segments 72b secured to the arm base 72a such that they can rotate and move up and down. The uppermost segment has a tip portion provided with the fork 52 constructed as above and made of vinyl chloride of a high corrosion resistance. The fork 52 may be made of PEEK, PEEK containing an SiC core, PCTFE, Fluorocarbon resin, or quartz.

The case 71 is made of vinyl chloride of a high corrosion resistance, and the bottom 75 has an outer portion and a stepped inner portion. The exhaust ports 74 are provided in an annular groove 78 formed in the outer portion, for exhausting the washing liquid after washing. An opening 79 is formed in a side wall of the case 71, for passing semiconductor wafers therethrough. A shutter 79a is provided for opening and closing the opening 79. When the opening 79 is closed, the atmosphere in the case 71 is isolated from that in a treatment chamber adjacent thereto.

The washing and drying nozzle member 80 has a vertical changeover arm 84. This arm is supported by a rotary actuator 83, secured to an upper portion of a side wall of the case 71, such that the arm can rotate in a vertical plane. The washing nozzle 81 and two drying nozzles 82 are arranged parallel with one another at the lower end of the changeover arm 84.

The washing nozzle 81 has a washing pipe 85, whose lower surface is provided with a plurality of liquid jet ports 85a arranged in two rows and inclining outward. Pure rinse water is supplied from a washing-liquid supply line 87 connected to a washing-liquid supply source (not shown), to the washing pipe 85 by way of a flexible tube 87a. The drying nozzle 82 has a drying pipe 86, whose lower surface provided with a plurality of gas jet ports 86a arranged in a row and inclining outward. N2 drying gas is supplied from a drying gas supply line 88 connected to a drying gas supply source (not shown), to the drying pipe 86 through flexible tubes 88a.

As is shown in FIG. 12, to wash the fork 52 of the arm 24 by means of the wash/dry nozzle member 80, pure water is jetted from the washing nozzle 81 onto the entire surface of the fork 52 in a state where the changeover arm 84 stands vertically, thereby removing a chemical or impurity attached to the fork 52. After a predetermined time period elapses, the supply of the washing liquid is stopped, and then N2 gas is jetted onto the fork 52 from the drying nozzle 82, thereby drying the same in a short time. Thus, the arm 24 is kept clean when used for transferring wafers.

When washing and drying are finished, the rotary actuator 83 operates to rotate the changeover arm 84 through 90°. Thus, the wash/dry nozzle member 80 moves toward the upper portion of the side wall of the case 71, where it does not interrupt carry-in and carry-out of wafers. A liquid receiver 89 is provided at an end of the changeover arm 84, for receiving pure water dripping from the washing nozzle 81 where the wash/dry nozzle member 80 is positioned near the upper portion of the side wall of the case 71.

Though the three units 10, 12, and 14 are used in the embodiment, the number of washing units employed may be varied. If the vessels arranged in a plane are integrated into one unit as shown in the above embodiment, any number of vessels required by semiconductor manufacturers can be provided with ease.

Further, the number of wafers 22 to be treated at a time in each vessel is not limited to 50 (for the two carries 48), but may be 25 (for one of them).

In addition, the invention is applicable also to a washing device for washing LCD substrates or printed boards.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A washing apparatus for performing a batch treatment of a plurality of wafer-like objects, comprising:
    a washing vessel;
    first support means, dedicated to the washing vessel, for supporting the objects in the vessel in a manner such that the objects are spaced from one another at predetermined intervals;
    driving means for moving the first support means up and down;
    receiving means for receiving the objects outside the washing vessel;
    transfer means for transferring the objects between the receiving means and first support means; and
    second support means, incorporated in the transfer means, for supporting the objects during transfer thereof in a manner such that the objects are spaced from one another at the same intervals as the predetermined intervals;
    wherein transfer of the objects between the first and second support means is performed above the washing vessel by moving the first support means up and down, and the apparatus further comprises additional washing means for washing the second support means of the transfer means, and isolation means for isolating atmosphere existing around the transfer means from that in the washing vessel during washing of the second support means.

2. The apparatus according to claim 1, wherein the first and second support means are kept out of contact with each other while the objects are transferred therebetween.

3. The apparatus according to claim 2, wherein each of the first and second support means has a fork provided with a plurality of teeth having grooves for holding the objects one by one, and the forks of the first and second support means face and engage with each other while the objects are transferred therebetween.

4. The apparatus according to claim 3, wherein the forks of the first and second support means are arranged with the teeth thereof alternately located.

5. The apparatus according to claim 1, wherein the first support means comprises the surface made of one of polyether-ether-ketone, polychlorotrifluoroethylene, and fluorocarbon resin.

6. The apparatus according to claim 1, wherein the second support means comprises the surface made of one of chloroethylene, quartz, polyether-ether-ketone, polychlorotrifluoroethylene, and fluorocarbon resin.

7. The apparatus according to claim 1, wherein the additional washing means comprises a washing nozzle for applying pure water onto the second support means, and a drying nozzle for applying an inactive gas onto the second support means.

8. The apparatus according to claim 7, wherein the washing and drying nozzles are supported by a rotatable arm, and can be moved between a position in which they wash the second support means and a position in which they retreat.

9. The apparatus according to claim 1, wherein the isolation means comprises a case receiving the additional washing means and having an opening for passing the transfer means therethrough, and closing means provided for closing the opening, thereby isolating atmosphere in the case from the outside thereof.

10. The apparatus according to claim 9, wherein the closing means comprises a shutter.

11. A washing apparatus for performing a batch treatment of a plurality of wafer-like objects, comprising:
    a washing vessel;
    first support means, dedicated to the washing vessel, for supporting the objects in the vessel in a manner such that the objects are spaced from one another at predetermined intervals;
    receiving means for receiving the objects outside the washing vessel;
    transfer means for transferring the objects between the receiving means and first support means;
    second support means, incorporated in the transfer means, for supporting the objects during transfer thereof;
    additional washing means for washing the second support means of the transfer means; and
    isolation means for isolating atmosphere existing around the transfer means from that in the washing vessel during washing of the second support means.

12. The apparatus according to claim 11, wherein the additional washing means comprises a washing nozzle for applying pure water onto the second support means, and a drying nozzle for applying an inactive gas onto the second support means.

13. The apparatus according to claim 12, wherein the washing and drying nozzles are supported by a rotatable arm, and can be moved between a position in which they wash the second support means and a position in which they retreat.

14. The apparatus according to claim 11, wherein the isolation means comprises a case receiving the additional washing means and having an opening for passing the transfer means therethrough, and closing means provided for closing the opening, thereby isolating atmosphere in the case from the outside thereof.

15. The apparatus according to claim 14, wherein the closing means comprises a shutter.

* * * * *